United States Patent [19]

Cohen et al.

[11] Patent Number: 4,973,921
[45] Date of Patent: Nov. 27, 1990

[54] MILLIMETER WAVE, LUMPED ELEMENT, VCO WITH ULTRABROADBAND TUNING

[75] Inventors: Leonard D. Cohen, Brooklyn; Eugene W. Sard, Huntington, both of N.Y.

[73] Assignee: Eaton Corporation, Cleveland, Ohio

[21] Appl. No.: 399,774

[22] Filed: Aug. 28, 1989

[51] Int. Cl.$^5$ ............................................. H03B 9/12
[52] U.S. Cl. ..................................... 331/77; 331/96; 331/107 DP; 331/107 G; 331/177 V
[58] Field of Search ............ 331/96, 107 DP, 107 SL, 331/107 C, 107 G, 117 D, 177 V, 74, 76, 77

[56] References Cited

U.S. PATENT DOCUMENTS

| | | | |
|---|---|---|---|
| 4,025,881 | 5/1977 | Cohen et al. | 333/98 R |
| 4,246,550 | 1/1981 | Cohen | 331/107 DP |
| 4,728,907 | 3/1988 | Cohen | 331/107 R |

OTHER PUBLICATIONS

"Wide Range Tuning of Solid State Microwave Oscillators", D. Cawsey, IEEE Journal of Solid State Circuits, Apr. 1970, pp. 82–84.
"FM and AM Noise in Microwave Oscillators", S. Hamilton, Microwave Journal, Jun. 1978, pp. 105–109.
"Varactor Tuned Gunn Oscillators with Wide Tuning Range for the 25 to 75 GHz Frequency Band", L. Cohen, IEEE-MIT-S International Microwave Symposium, Apr. 1979.
"A Wideband, Backshort-Tunable Second Harmonic W Band Gunn Oscillator", H. Barth, 1981 IEEE MIT-S Symposium Digest, pp. 334–337.
"Active Phase Shifters for the Millimeter and Microwave Bands", L. Cohen, 1984 IEEE MIT-S Digest, pp. 397–399.
"Wideband Electronically Tunable GaAs Gunn VCO's at W-Band (75-110 GHz)", J. Ondria, 1985 IEEE MIT-S Symposium Digest, pp. 375–378.
"Frequency/Temperature Compensated Millimeter-Wave Oscillators and Broadband VCO's in Lumped-Element and Printed-Circuit Forms", L. Cohen et al., 1986 IEEE MIT-S International Microwave Symposium Digest, pp. 169–172.
Avantek Product Guide Catalog, 1987, p. 67.
"Recent Advances in the Modelling and Performance of Millimeter Wave InP and GaAs Gunn VCO's and Oscillators", L. Cohen and E. Sard, 1987 IEEE-MIT-S International Microwave Symposium Digest, pp. 429–432.
"4 to 40 GHz Even Harmonic Schottky Mixer", J. Merenda et al., 1988 IEEE MIT-S International Microwave Symposium Digest, pp. 695–698.
"CMW Series Wideband Electronically-Tuned Gunn Oscillators", Central Microwave Company, Maryland Heights, Mo., Jun. 1988.
"Millimeter Wave, Lumped Element Gunn VCO's with Ultrawide-band (20 GHz) Tuning", L. Cohen and E. Sard, 1989 IEEE-S International Microwave Symposium, Jun. 13-15 1989.
"Microwave Oscillator Circuits", S. Hamilton, Microwave Journal, Apr. 1978, pp. 63–66 and 84.

Primary Examiner—Siegfried H. Grimm
Attorney, Agent, or Firm—Andrus, Sceales, Starke & Sawall

[57] ABSTRACT

A varactor tuned oscillator (10), VCO, operational in the millimeter wave range including frequencies greater than 30 GHz, includes a lumped element active circuit (12) with a negative resistance, a lumped element tuning circuit (16) coupled to the active circuit and providing resonant circuitry in combination therewith, and a VCO output (26) reactively terminated at the fundamental frequency of oscillation and generating a higher order output harmonic at least as high as the second order. The reactive termination at fundamental frequency eliminates the intrinsic diminishing effect on tuning range of resistive loading, to extend tuning range and provide an ultrabroadband VCO. The VCO output (26) is resistively loaded at the higher order harmonic. The output is obtained from the higher order harmonic generated in-situ in the active element (14). Measured performance included continuous tuning from 46 to 66 GHz, a 20 GHz tuning range, with a maximum power output of +6 dBm.

21 Claims, 5 Drawing Sheets

FIG. 6 CALCULATED AND MEASURED TUNING CHARACTERISTICS OF SECOND HARMONIC, LUMPED ELEMENT, GUNN VCO

FIG. 7 MEASURED PERFORMANCE OF SECOND HARMONIC, LUMPED ELEMENT, GUNN VCO

FIG. 10 MEASURED PERFORMANCE OF MULTIOCTAVE MICROWAVE VCO
MM WAVE VCO DOWNCONVERTED WITH 45.69 GHz LO

MILLIMETER WAVE, LUMPED ELEMENT, VCO WITH ULTRABROADBAND TUNING

BACKGROUND AND SUMMARY

The invention relates to a millimeter wave, lumped element, varactor tuned oscillator, VCO.

A VCO is an oscillator whose output frequency is electronically controlled. In solid state VCO's, the electronic tuning capability is provided by a voltage controlled capacitive element, a varactor diode, that is an integral part of the VCO circuit. The magnitude of the frequency change that can be produced in the VCO is a function of the maximum to minimum capacitance ratio of the varactor and the undesired padding effect (reduction) on the varactor capacitance ratio by other capacitive elements in the circuit, including circuit and diode package parasitics. In an ideal situation, the varactor would be the only capacitive energy storing element in the circuit, and hence it would have maximum control of the VCO tuning range. In addition to the capacitance ratio of the varactor, the output (resistive) loading is another factor that reduces VCO tuning range. The effect of resistive loading, when tranformed to the terminals of the VCO active element, is to decrease the effective capacitance ratio of the varactor. Hence, a load should be lightly coupled to a VCO when maximum tuning range is a performance objective. These basic considerations in wide band tuning of a Gunn VCO have resulted in a maximum tuning range of 7% of center frequency, a ±2 GHz (gigahertz) tuning band at a center frequency of 57.5 GHz, in commercially available waveguide (distributed circuit) type VCO's, "CMW Series Wideband Electronically-Tuned Gunn Oscillators", Central Microwave Company, Maryland Heights, Mo., June 1988.

The present invention provides an ultrawideband, lumped element, varactor tuned millimeter wave VCO. In one embodiment, the VCO has a ±10 GHz tuning band at a center frequency of 56 GHz, which 20 GHz tuning band (35.7% range) is five times the tuning range available with existing Gunn VCOs in the same frequency band.

DETAILED DESCRIPTION

Figures 1, 2, 4:
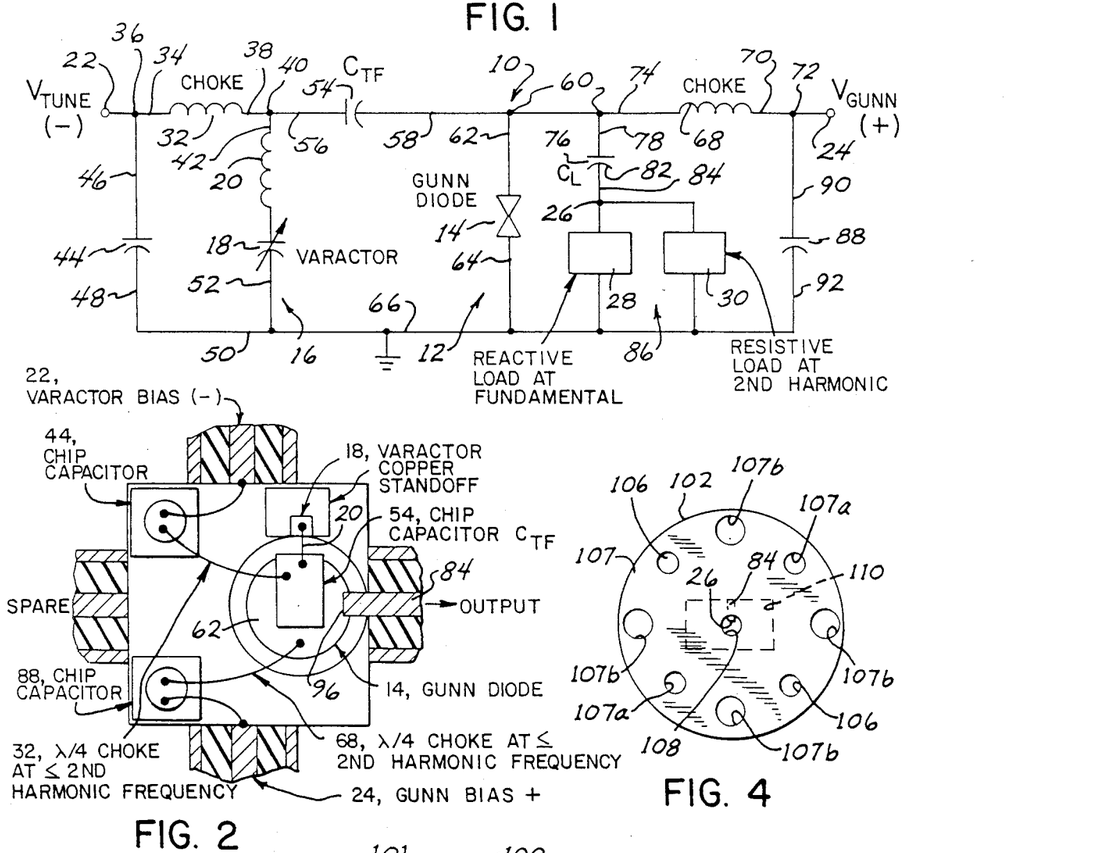
FIG. 1 is a circuit diagram showing a VCO circuit constructed in accordance with the invention.
FIG. 2 shows the physical layout of the circuitry of FIG. 1.
FIG. 4 is an end view of a portion of FIG. 3.

FIG. 1 is a circuit diagram showing a varactor tuned oscillator, VCO, operational in the millimeter wave range including frequencies greater than 30 GHz in accordance with the invention, and FIG. 2 shows the packaged form in a 0.074 inch square package. Oscillator 10 includes a lumped element active circuit 12 including an active element 14, such as a Gunn or Impatt diode, FET, etc. The oscillator includes a lumped element tuning circuit 16 coupled to active circuit 12 and providing resonant circuitry in combination therewith. Tuning circuit 16 includes a varactor diode 18 and inductance 20. The lumped element circuit concept is based on the use of circuit elements that are sufficiently small (electrically), that they are functionally characterized as lumped elements. Inductive element 20 is a short length of line that provides the electrical connection between discrete components. A first bias port 22 is provided for varactor tuning, and a second bias port 24 is provided for biasing active element 14. Output 26 of the VCO is reactively terminated by load 28 at the fundamental frequency of oscillation, and is resistively loaded by load 30 at the second order harmonic, or other higher order harmonic.

A first quarter wave choke 32 at ≦ second order harmonic has a first terminal 34 connected at node 36 to bias port 22, and a second terminal 38 connected at node 40 to a first terminal 42 of tuning circuit 16. A low pass RF bypass filter is provided by a chip capacitor 44 having a first terminal 46 connected to node 36, and a second terminal 48 connected to ground at return conductor 50 which is also connected to the second terminal 52 of tuning circuit 16. Tuning circuit 16 is coupled to active circuit 12 by a DC blocking capacitor 54 having a first terminal 56 connected at node 40 to first terminal 42 of tuning circuit 16, and having a second terminal 58 connected at node 60 to first terminal 62 of active circuit 12. Second terminal 64 of active circuit 12 is connected through ground return reference 50 to second terminal 52 of tuning circuit 16. Quarter wave choke 68 at ≦ second order harmonic has a first terminal 70 connected at node 72 to bias port 24, and a second terminal 74 connected at node 60 to first terminal 62 of active circuit 12. VCO output 26 is capacitively coupled to active element 14 by capacitor 76 having a first terminal 78 connected to node 60 between terminal 74 of choke 68 and terminal 62 of active circuit 12, and a second terminal 82 coupled through conductor 84 to load circuit 86. A low pass RF bypass filter is provided by a chip capacitor 88 having a first terminal 90 connected to node 72 and a second terminal 92 connected through ground return reference 50 to second terminal 64 of active circuit 12.

Figure 3:
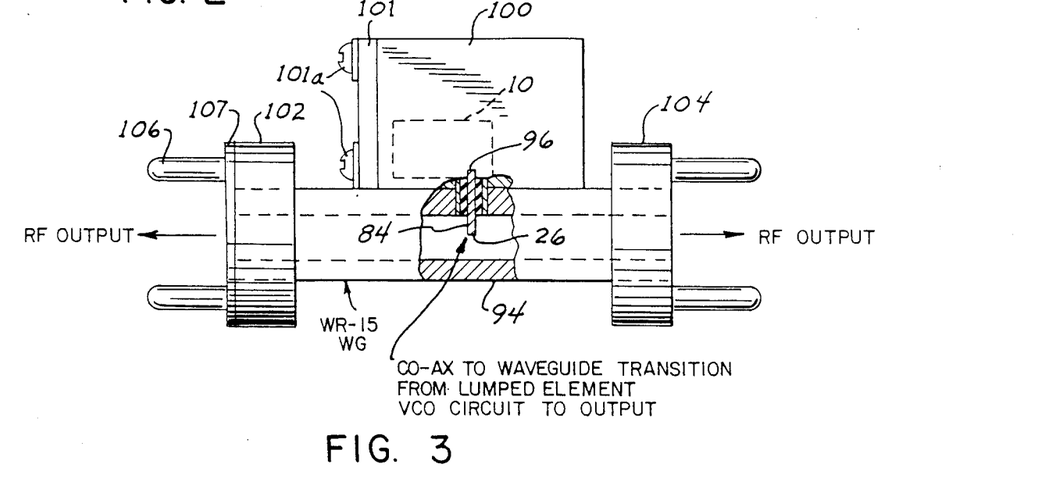
FIG. 3 shows the circuit of FIG. 2 coupled to an output waveguide.

Load circuit 86 is an output waveguide 94, FIG. 3, for example a WR-15 waveguide cutoff at fundamental frequency and propogating the second order harmonic providing a high pass filter. Output conductor 84 couples the active element of the VCO to load circuit 86. Conductor 84 has a first end 96, FIG. 2, at first terminal 62 of active circuit 12, and a second end 26 at load circuit 86. End 26 is within waveguide 94. Capacitor 76 is connected between end 96 of conductor 84 and terminal 62 of active circuit 12. In one embodiment, conductor end 96 is spaced from terminal 62 by an air gap therebetween, and capacitor 76 is provided by such air gap. The VCO circuitry is enclosed within housing cover 100 mounted on waveguide 94 and closed by a cover 101 mounted to the housing by screws 101a. The waveguide is a standard part, and has circular end flanges 102 and 104 with dowel pins such as 106 extending therefrom. Flange 102 has a disc 107 thereon with a circular aperture 108, FIG. 4, through which the RF output propagates from the waveguide 94. As is standard, disc 107 has dowel pin clearance holes 107a and screw holes 107b.

The present invention provides a VCO having a demonstrated tuning range of 35.7%, a ±10 GHz tuning band at a center frequency of 56 GHz, which is 5 times the tuning range available with existing Gunn VCO's in the same frequency band. The enhanced tuning capability with the disclosed VCO follows from the following aspects of its design.

(1) A lumped element circuit form is used which is inherently more broadband than a distributed circuit.

(2) A lumped element circuit form is used which inherently minimizes circuit parasitics, and hence the diminishing effect on varactor capacitance ratio due to the parasitics.

(3) A VCO circuit is tuned at fundamental frequency with output obtained from the in-situ generated second harmonic, or higher order harmonic, of the active element, such as a Gunn diode, Impatt diode, etc. The in-situ harmonic generation eliminates the need for a separate broadband doubler circuit.

(4) A VCO circuit is varactor tuned at fundamental frequency with the fundamental oscillator circuit reactively terminated. A reactive termination on the tunable fundamental oscillation band has the desirable effect of eliminating the diminishing effect on the tuning range of a VCO due to resistive loading. This tuning arrangement contrasts with that of a fundamental VCO in which the output (resistive) loading of the VCO manifests itself directly in the tuning circuit by a reduction in the effective capacitance ratio of the varactor. In the second harmonic VCO described herein, the output loading is manifest in the second harmonic portion of the circuit and tuning is performed at the reactively terminated fundamental circuit portion. Although the second harmonic output is transparent to the load, the tuned fundamental is isolated from the load by the conversion loss of the harmonic generating mechanism in the active element 14 of the VCO, and from the output waveguide 94 being cutoff to fundamental frequency. With a Gunn diode as the active element, as was used in the demonstrated second harmonic VCO, second harmonic output is typically 15-20 dB below the fundamental power generating capability and is indicative of the level of isolation between fundamental tuning and second harmonic output loading.

(5) A VCO circuit is used which provides a broadband reactive termination to the tuned fundamental oscillation, the reactive termination being in close proximity to the Gunn diode. The reactive termination is located close to the Gunn diode in order to ensure continuous tuning performance, i.e. no holes or jumps in the tuning characteristic. This is especially important in an ultrawideband VCO since a long intermediate line length (greater than a quarter wave length) can result in a multiplicity of resonance conditions and the potential for tuning discontinuities. The lumped element circuit embodiment with its inherently small circuit element size is well suited for satisfying the criteria of short line length.

(6) Inherently broadband second harmonic output is provided since the second harmonic circuit is untuned. The second harmonic is generated in-situ with fundamental tuning of the Gunn diode and is capacitively coupled to the output port. This is in contrast to the radial mode resonator disc type VCO distributed circuit, J. Ondria, "Wideband Electronically Tunable GaAs Gunn VCO's at W-Band (75-110 GHz)", 1985 IEEE MTT-S Symposium Digest, PP 375-378. In this latter type circuit, the size of the radial disc and its position above the ground plane are the primary factors that control the frequency of the high Q second harmonic tuned circuit.

(7) A lumped element VCO circuit form is used which can be either a series tuned VCO or a parallel tuned VCO by proper choice of the value of its circuit elements. This fundamental flexibility allows its use with active elements that are best suited in either the series or parallel configuration for optimum performance characteristics. For example, an avalanche diode is best suited to a series tuned circuit, while a Gunn diode is best suited to a parallel tuned circuit, S. Hamilton, "Microwave Oscillator Circuits," Microwave Journal, April 1978, pages 63-66, and 84.

The functional flexibility of the lumped element circuit contrasts with that of a commonly used radial mode resonator disc type second harmonic distributed Gunn oscillator circuit that is difficult to varactor tune in a parallel tuned VCO configuration, H. Barth, "A Wideband, Backshort-Tunable Second Harmonic W Band Gunn Oscillator," 1981 IEEE MTT-S Symposium Digest, pp. 334-337. The distributed disc type circuit is embedded in a waveguide embodiment that propagates the second harmonic and is cutoff to reactively terminate the fundamental. Since the waveguide is cutoff to energy propagation at fundamental frequency, it is difficult to effectively shunt tuning elements to tune the fundamental. By contrast, the basic nature of a lumped element circuit supports the existence of all frequencies. The existence of waveguide modes is prevented. Both the fundamental and second harmonic portions of the lumped element circuit are accessible, and the circuit elements can be chosen to provide for series or parallel tuning of the active element. A separate and distinct waveguide section that is cutoff to fundamental and propagates second harmonic is used to reactively terminate the fundamental. This waveguide section is located very close to the lumped element VCO circuit and is interfaced to it with a short section of coax transmission line 84. By contrast, in the radial mode resonator disc type VCO circuit, Ondria reference, supra, the cutoff output waveguide is not separate and distinct from the VCO circuit due to the completely distributed nature of the circuit.

(8) A broadband VCO circuit is used which provides immunity to the undesirable known effect of load pulling on VCO performance. This effect is manifest as a change in VCO frequency due to the often encountered situation in normal VCO usage of a mismatched output load. This condition is alleviated by the use of an external isolation component (ferrite isolator, buffer amplifier, attenuator) between the VCO and load. The inherent isolation of the second harmonic output from the fundamental tuning circuit by the in-situ harmonic generating mechanism, and the elimination of energy propagation at fundamental energy in the output waveguide (cutoff to fundamental) provide the immunity to load pulling. The immunity means that an external isolation element can be eliminated in most applications.

(9) A second harmonic VCO is provided with dual output waveguide ports 102 and 104. The output waveguide 94 propagates second harmonic frequency and is cutoff to fundamental. An adjustable or fixed short is used at one of the two output ports for the purpose of optimization of output power level. The short does not affect the tunable fundamental oscillation since the output waveguide is cutoff to fundamental frequency. The VCO output configuration of dual output ports also affords a demonstrated feature that the output power level at the two output ports can be set to be equal or unequal. If a fixed short is located at one port, all the generated VCO power will be available at the other port. If the fixed short is removed, there will be an even split of power at the two output ports. If an iris plate or disc 107 with a central circular aperture 108, FIG. 4, is suitably located at one port, there will be an unequal split of power at the two ports, with the lesser level at the apertured port. The amount of energy transmitted through a circular aperture will increase with the diameter of the aperture. This integral power dividing arrangement eliminates the need for an external directional coupler, with its added size, weight and cost, in an application such as phase locking a VCO where both a low level output to the phase lock electronics and a high level main line output are required. Another application is to provide dual (equal or unequal) outputs for coherent local oscillator drives for dual mixers in a receiver.

As above noted, in prior art wideband millimeter wave VCO technology, there are commercially available varactor tuned distributed circuit (waveguide) type Gunn VCO's with ±2 GHz tuning range in a frequency band centered at 57.5 GHz, "CMW Series Wideband Electronically-Tuned Gunn Oscillators", Central Microwave Company, Maryland Heights, Mo., June 1988. The performance demonstrated with the presently disclosed lumped element VCO is ±10 GHz, a factor of 5 larger than that in the prior art in the same frequency band. A varactor tuned frequency range of 10% at 94 GHz has also been reported in the prior art with a distributed (waveguide) Gunn VCO circuit using a series tuned second harmonic disc type radial resonator, Ondria reference, supra. By contrast, the demonstrated performance of the presently disclosed parallel tuned lumped element VCO was 35.7% centered at 56 GHz, a factor of 3.6 larger than the reported second harmonic VCO. The performance advantage of the presently disclosed parallel tuned VCO would be larger than 3.6 times had the VCO been series tuned as was the radial disc resonator VCO, Ondria reference, supra. Series tuning is known to give wider band tuning as compared to parallel tuning, D. Cawsey, "Wide Range Tuning of Solid State Microwave Oscillators," IEEE Journal of Solid State Circuits, April 1970, pp. 82-84. The comparative results cited above give evidence of the superiority of the presently disclosed lumped element VCO circuit over the prior art in VCO technology. A lumped element second harmonic Gunn diode oscillator circuit was disclosed by Leonard D. Cohen in "Varactor Tuned Gunn Oscillators With Wide Tuning Range for the 25 to 75 GHz Frequency Band', IEEE-MTT-S International Microwave Symposium, April 1979, Orlando, Fla. The demonstrated performance obtained with the lumped element circuit described in this latter paper was a 10 GHz tuning range, centered at 55 GHz, with an average output power of 0.65 mw (milliwatts) over the tuning band. In addition, a 13 GHz tuning range, center at 64.5 GHz, with an average of 0.24 mw over the band was demonstrated. The performance demonstrated with the presently disclosed lumped element VCO was a tuning range of 20 GHz, centered at 56 GHz, with an average power of 1.9 mw over the band. These latter results show a significant increase in tuning capability and output power over that of the previous lumped element VCO.

The prior art also includes U.S. Pat. No. 4,246,550, entitled "Wideband, Millimeter Wave Frequency Gunn Oscillator". The innovative features in the presently disclosed VCO that have resulted in significantly enhanced performance compared with U.S. Pat. No. 4,246,550 are as follows.

| Present Disclosure | U.S. Pat. No. 4,246,550 |
|---|---|
| The varactor tuned fundamental oscillation is reactively terminated in close proximity to the Gunn diode. Hence, energy circulation at fundamental frequency is limited to a small region of the circuit which translates to lower circuit loss and higher second harmonic output. Measured performance shows up to an 8 times increase in average output power relative to that of second harmonic VCO's without a reactively terminated fundamental ('550 patent). | The varactor tuned fundamental oscillation is not reactively terminated and energy can circulate into the output waveguide section. The output waveguide is not cutoff to fundamental frequency. |
| Output power is obtained from the second harmonic portion of the VCO circuit which is isolated from the varactor tuned fundamental portion of the circuit. The elimination of output (resistive) loading effects from the tuning circuit enhances the tuning range of the VCO. (Resistive loading effects in the tuning circuit would be manifest as a diminished varactor capacitance ratio, and hence a diminished tuning range). Measured tuning range performance with a reactively terminated fundamental was 1.5 times larger than that of a VCO with resistive loading effects. | Output loading effects are present in the varactor tuned fundamental circuit since the output waveguide was not cutoff to fundamental frequency. This diminishes the effective capacitance ratio of the varactor and results in a diminished tuning range |
| Output waveguide is cutoff to the propagation of energy at fundamental frequency. Only second harmonic can propagate. This arrangement isolates the fundamental from the output load and makes the load transparent only to second harmonic. It thereby allows for independent circuit adjustments at fundamental and second harmonic for the realization of optimum | Output waveguide can propagate both fundamental and second harmonic energy. Difficult to obtain optimum performance since output circuit adjustments for maximum output at second harmonic, for example, simultaneously affect the tuning and power generating characteristics of the varactor tuned fundamental. |

| Present Disclosure | U.S. Pat. No. 4,246,550 |
| --- | --- |
| tuning and output power performance. | The dissipative loss due to fundamental energy propagation in the output waveguide will be manifest as reduced second harmonic output and reduced tuning range. |
| The varactor tuned fundamental oscillation circuit is isolated from mismatched output loading effects since output is obtained from the in-situ generated second harmonic. This loading effect is known as pulling and would cause VCO frequency to deviate from its intended value with changing load conditions. The immunity to output loading follows from the isolation inherent in the in-situ harmonic generation mechanism in the active element and to the use of a circuit that does not allow propagation of fundamental energy in the output waveguide. This load immunity in the second harmonic VCO translates to the elimination of an external ferrite isolator, buffer amplifier or attenuator at the VCO output in many applications. The use of an isolator, buffer amplifier or attenuator load isolation is mandatory when using a fundamental VCO. | The varactor tuned fundamental oscillation circuit is directly affected by the load and the VCO is subject to load pulling effects. The tuning circuit is transparent to the load. |
| The Gunn and varactor diodes are independently biased* which translates to an additional degree of freedom in circuit design for optimum VCO performance characteristics. No biasing sequence is required. (*It should be noted that in the prior art such as in the Ondria reference, supra, the circuit arrangement used does not allow for independent biasing of the Gunn and varactor diodes. Varactor bias is relative to Gunn bias.) | Gunn and varactor diodes have a common bias connection and are not independently biased. Varactor bias is relative to Gunn bias. A biasing sequence is required in that varactor bias must be applied before Gunn bias is applied, in order to avoid damage to the varactor diode. A turn on sequence is a disadvantage. |

The present VCO is also described in our technical paper entitled "Millimeter Wave, Lumped Element, Gunn VCO's With Ultrawideband (20 GHz) Tuning", L. Cohen and E. Sard, 1989 IEEE-MTT-S International Microwave Symposium, June 13-15, 1989, pp. 1927-1930, incorporated herein, and to which reference is now made.

A new millimeter wave Gunn VCO with ultrawideband tuning has been developed and modeled. The VCO is tuned at its reactively terminated fundamental frequency and output is obtained from the in-situ generated Gunn diode second harmonic. Measured performance includes continuous tuning from 46 to 66 GHz, a 20 GHz tuning range, with a maximum power output of +6 dBm.

Prior art reported results have shown that the intrinsic advantages of a lumped element circuit form can be realized in practice at millimeter wave lengths with oscillators and VCO's, L. D. Cohen and E. Sard, "Recent Advances in the Modelling and Performance of Millimeter Wave InP and GaAs Gunn VCO's and Oscillators", 1987 IEEE-MTT-S International Microwave Symposium Digest, pp. 429-432, and mixers, J. L. Merenda, D. Neuf, P. Piro, "4 to 40 GHz Even Harmonic Schottky Mixer", 1988 IEEE-MTT-S International Microwave Symposium Digest, pp. 695-698. These advantages include broadband, continuous and spurious free performance, circuit loss comparable to that of a waveguide circuit, miniature circuit size, simple circuit topology and greater resolution and accuracy in circuit modelling and performance analysis as compared to commonly used distributed type circuits. The virtues of lumped element circuit technology have been used as the basis for the development of the present ultrabroadband Gunn VCO that is varactor tuned over the 46 to 66 GHz band, a tuning range of 20 GHz. This tuning capability exceeds that of prior art VCO's in this frequency band by a factor of 5. The presently disclosed ultrawideband VCO's can be used for full waveguide band fast tuning drivers, for wideband swept local oscillator receivers, and for instrumentation applications.

New VCO results and technology presented are as follows.

(a) A new lumped element circuit for an ultrabroadband, second harmonic, varactor tuned, Gunn VCO.

(b) A measured continuous tuning range of 20 GHz in a V band (50 to 75 GHz) VCO, which is five times the tuning capability of existing Gunn VCO's in this waveguide band.

(c) A linear tuning range of 9 GHz, which is 45 percent of the total tuning range.

(d) In-situ second harmonic generation in the Gunn diode, eliminating the need for a separate broadband doubler circuit.

(e) Efficient and broadband Gunn diode second harmonic generation by reactively terminating the varactor tuned fundamental oscillation close to the Gunn diode.

(f) A comparison of the relative second harmonic generation capabilities of GaAs and InP Gunn diodes from the measured performance of second harmonic VCO's.

(g) Modelling and analysis results of lumped element second harmonic Gunn VCO's, including quantification of the model elements. Excellent agreement has been obtained between the measured and calculated tuning characteristics.

(h) Increased immunity to load pulling as compared to a fundamental output VCO. This translates to the elimination of an output isolator in many applications.

The second harmonic Gunn VCO is designed to varactor tune the Gunn diode at fundamental frequency and to use the in-situ generated Gunn second harmonic as output. The fundamental oscillation is reactively terminated close to the Gunn diode. This has the favorable effect of enhancing the tuning capability of the VCO since the intrinsic diminishing effect on tuning range of resistive loading is eliminated.

A circuit diagram and layout of a second harmonic, lumped element, Gunn VCO for a V band (50 to 75 GHz) VCO is shown in FIGS. 1 and 2. The lumped element concept is based on the use of circuit elements that are sufficiently small that they can be characterized as lumped components. The 0.074 in.×0.074 in. notch into which the lumped element circuit is assembled is sized to be cutoff to waveguide modes in the output frequency range of interest, thereby providing integrity to the lumped element circuit form. The discrete circuit elements include a packaged Gunn diode 14, a hyperabrupt junction GaAs chip varactor 18, and three MIS chip capacitors 44, 54, 88. The inductive elements are the short lengths of line such as 20 that provide the electrical connection between the discrete elements. The Gunn and varactor diode bias chokes 32, 68 are nominally a quarter wavelength long at the center of the output frequency band. The second harmonic output is capacitively coupled at 76 from the circuit and transmitted with coax, center conductor 84, to a WR-15 section of output waveguide 94 by the small diameter (0.034 in. outer diameter) coax. The coax center conductor 84 at the waveguide end 26, FIG. 3, of the coax provides a broadband transition from the nominal 50 ohm level of the VCO circuit to the nominal 400 ohm impedance level of the waveguide. The output waveguide is cutoff to the fundamental frequency band which enables the Gunn diode to be reactively terminated in this frequency range.

Figure 5:
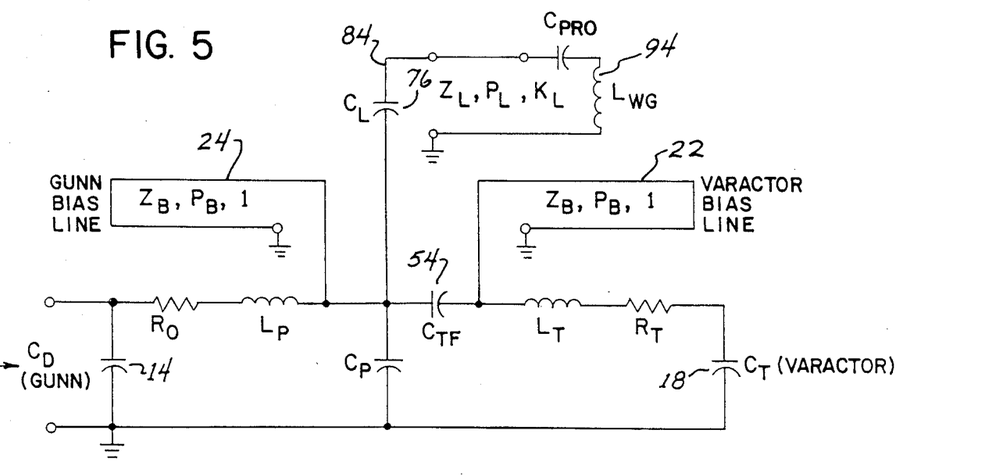
FIG. 5 shows the equivalent circuit model of the second harmonic, varactor tuned, lumped element, Gunn oscillator of FIGS. 1 and 2.

The equivalent circuit model of the second harmonic Gunn VCO 10 of FIGS. 1 and 2 is shown in FIG. 5, where:

$Z_L$ = Output coax transmission line impedance (50 ohm nominal)

$P_L$ = Length of output coax transmission line (between VCO circuit and output waveguide)

$K_L$ = Dielectric constant of output coax transmission line dielectric (Teflon, typ.)

$Z_B$ = Impedance of varactor diode and Gunn diode bias lines (air dielectric, $K_B = 1$)

$P_B$ = Length of varactor diode and Gunn diode bias lines $C_{PRO}$ = Capacitance of probe (coax center conductor end 26)

$L_{WG}$ = Equivalent inductance of output waveguide (94) at fundamental frequency (output waveguide cutoff to fundamental frequency)

$C_L$ = Output coupling capacitance $C_D$ = Gunn diode domain capacitance $R_O$ = Gunn diode low field (dissipative) resistance $L_P$ = Gunn diode package inductance $C_P$ = Gunn diode package capacitance $C_{TF}$ = Blocking capacitance $L_T$ = Tuning inductance $R_T$ = Tuning circuit resistance (includes varactor resistance)

$C_T$ = Varactor capacitance

Figure 6:
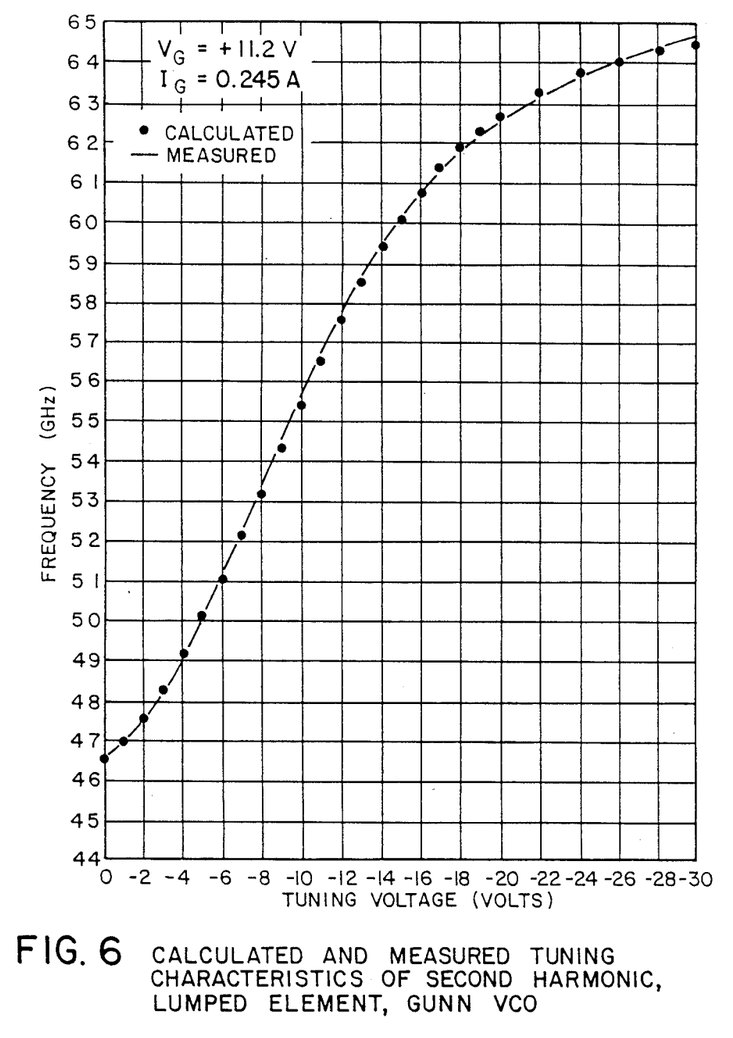
FIG. 6 is a graph showing tuning characteristics of a VCO in accordance with the invention.
Figure 7:
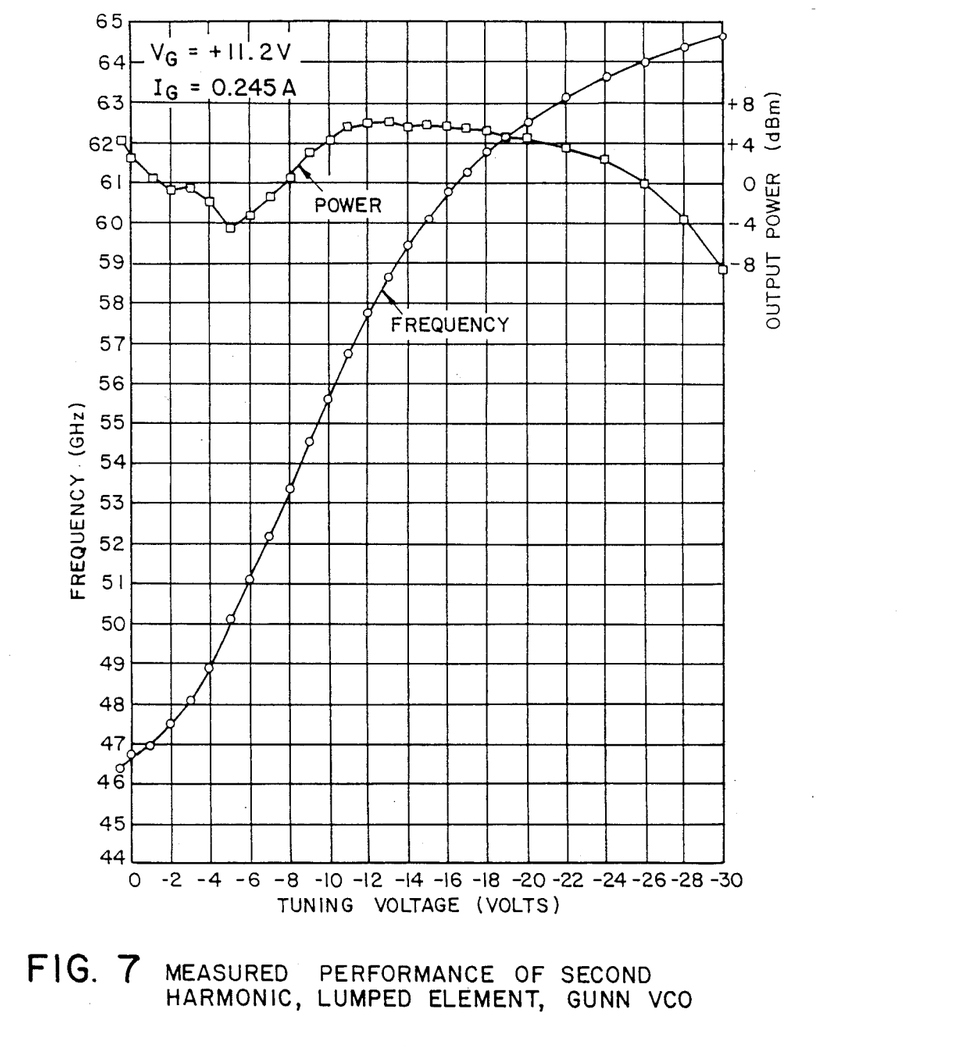
FIG. 7 is a graph showing performance of a VCO in accordance with the invention.

The model includes the ccax line 84 ($Z_L$, $P_L$, $K_L$) from the Gunn diode 14 to the output waveguide section and the Gunn and varactor bias lines 24, 22 ($Z_B$, $P_B$, 1). Each bias choke is a thin wire above ground ($K_B = 1$, where $K_B$ is the dielectric constant of air). The circuit elements in the model were quantified in the manner described in L. D. Cohen and E. Sard, "Recent Advances in the Modelling and Performance of Millimeter Wave InP and GaAs Gunn VCO's and Oscillators", 1987 IEEE-MTT-S International Microwave Symposium Digest, pp. 429–432. The calculated tuning characteristic of an InP Gunn VCO, based on the quantified model, is shown in FIG. 6 and compared to the measured characteristic, where $V_G$ is Gunn diode bias voltage, and $I_G$ is Gunn diode bias current. The tuning characteristics are in close agreement, the maximum frequency difference being 0.6 percent. The tuning and output characteristics of the VCO are shown in FIG. 7. For these measurements, a fixed short was used at one of the output ports and was set for maximum tuning range. The other port at flange 102 was the output port of the VCO. The VCO tuned from 46.4 to 64.7 GHz, an 18.3 GHz tuning range, with a maximum tuning voltage of −30 volts. Linear tuning was exhibited over a 9 GHz tuning range, from 48.7 to 57.7 GHz, with a corresponding tuning range voltage of −4 to −12 volts. An additional 1.2 GHz of tuning was obtained with an increase of tuning voltage to −46 volts. Zero varactor current was observed over the full tuning range. The power dip at the high frequency end of the band was due to an oversized circuit cutout that was not cutoff to waveguide modes in this region of the tuning band. The power dip at the low end of the band is expected to be eliminated with a shorter length of coax 84 between the VCO circuit and its waveguide output. Up to 2 GHz of additional tuning at the low end of the band is expected with a DC blocking capacitor 54 of higher value than the 1.5 pF (picofarad) capacitor used. The 1.5 pF blocking capacitor was comparable to the 1.95 pF zero bias capacitance of the hyperabrupt junction tuning varactor. Hence, the tuning range and linearity at the low end of the band in the data shown in FIG. 7 was diminished by the padding of the varactor capacitance by capacitor 54.

An ultrabroadband millimeter wave VCO has been described. The VCO is varactor tuned at fundamental frequency and output is obtained from the in-situ generated Gunn diode second harmonic. Inherently broadband tuning capability is provided by the use of a lumped element circuit form, reactively terminating the varactor tuned fundamental oscillation band, and the use of the in-situ generated Gunn diode second harmonic as output. Measured performance includes continuous VCO tuning from 46 to 66 GHz, a 20 GHz tuning range, with maximum power output of +6 dBm. This tuning capability exceeds that of prior art Gunn VCO's in this frequency band by a factor of five. It is projected that the VCO technology can be extended to provide full waveguide band VCO's into at least V band (50 to 75 GHz).

Prior art VCO's exhibit up to octave range tuning capability in the microwave band (to 18 GHz). For example, frequency coverage of the microwave band is available with commercial VCO's having tuning ranges of 1 to 2 GHz, 2 to 4 GHz, 4 to 8 GHz, 8 to 12 GHz, and 12.4 to 18 GHz, Avantek Product Guide Catalog, 1987, page 67. Thus, five VCO's are required to cover the microwave band from 1 to 18 GHz. In addition, these VCO's would require a switching arrangement to establish the composite microwave band coverage.

With the use of the present ultrabroadband millimeter wave VCO, a frequency range greater than 1 to 18 GHz can be covered with only one VCO, and several ancillary components. Accordingly, this latter arrangement provides full microwave band coverage with fewer components, lower cost, smaller size, lower power consumption and shorter tuning time than previously possible with the multiplicity of VCO's that otherwise need to be used. The shorter tuning time results from the elimination of the switches, and their switching times, that are associated with an arrangement that uses a multiplicity of VCO's.

Figure 8:
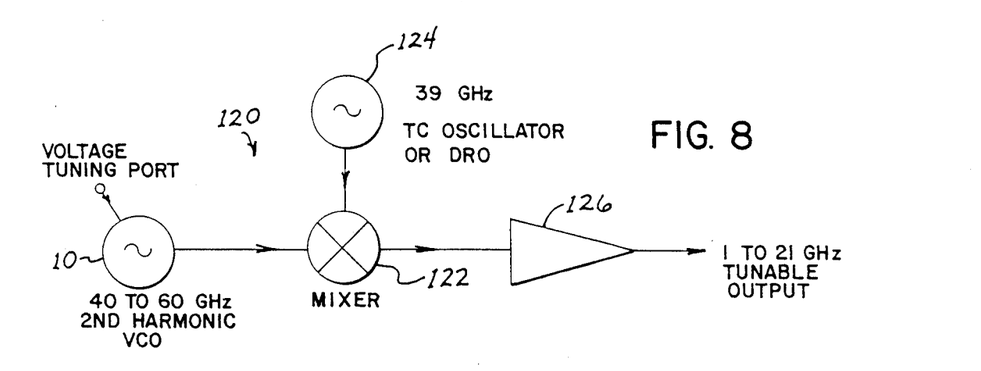
FIG. 8 shows a multi-octave microwave VCO system.

A block diagram of a new multi-octave microwave VCO system 120 is shown in FIG. 8, using the ultrabroadband 40 to 60 GHz second harmonic type VCO 10 above described. The 40 to 60 GHz output of VCO 10 is down converted at mixer 122 with a stable 39 GHz local oscillator 124 which translates the 20 GHz tuning range of the VCO to a 1 to 21 GHz output. The stable local oscillator is a DRO (dielectric resonator oscillator), or a temperature compensated oscillator as shown in U.S. Pat. No. 4,728,907. The output amplifier 126 is optional and would be used when an output level greater than 1 mw is required. With the arrangement shown in FIG. 8, voltage tuning of the 40 to 60 GHz VCO results in a 1 to 21 GHz down converted output that follows the tuning of the VCO. As noted above, the conventional use of an isolator between the VCO and the mixer is not required with the second harmonic VCO, and is a consequence of the inherent isolation of the tuning circuit of the VCO from the load (mixer). By the appropriate choice of local oscillator frequency, the 20 GHz tuning range of the 40 to 60 GHz VCO can be translated by the mixer to a 20 GHz wide output frequency band other than the 1 to 21 GHz shown in FIG. 8. For example, with a 34 GHz local oscillator, the translated output frequency would be 6 to 26 GHz.

Figure 10:
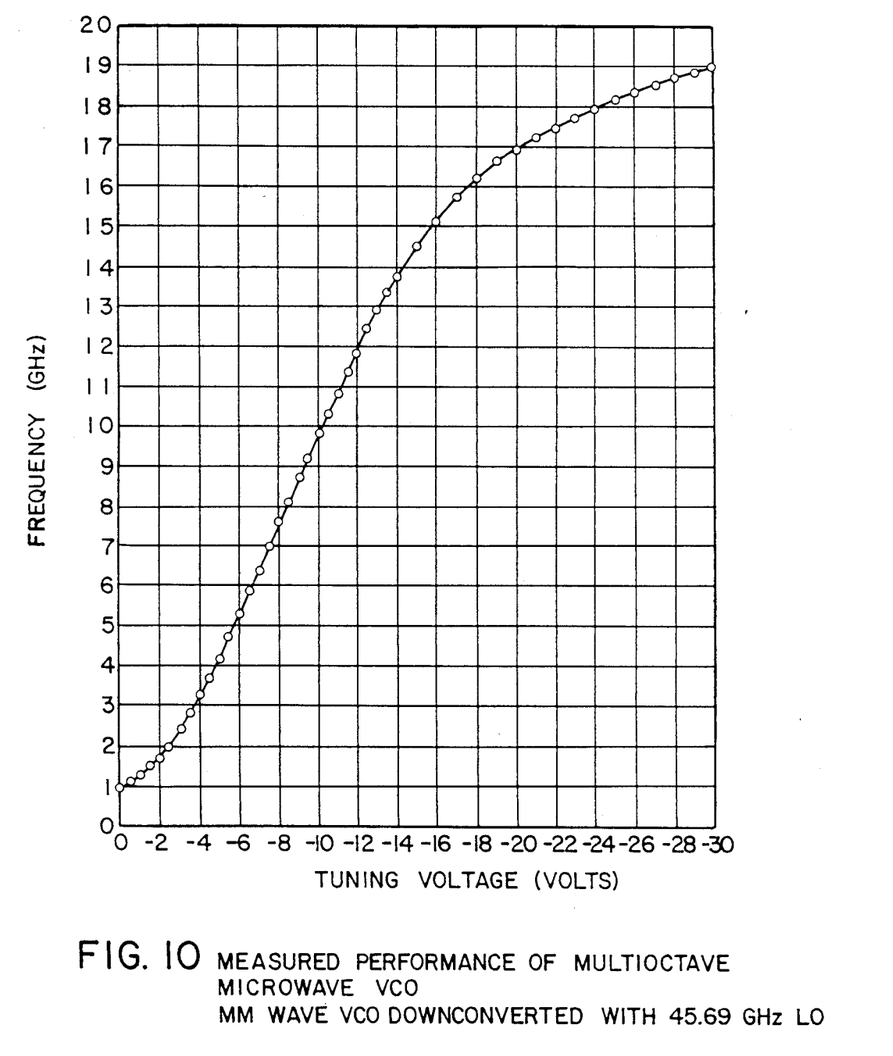
FIG. 10 is a graph showing tuning characteristics of a multi-octave VCO system in accordance with FIG. 8.

The measured tuning characteristic of a microwave multi-octave (1 to 19 GHz) VCO, of the form described in FIG. 8, is shown in FIG. 10. The millimeter wave VCO that was down converted had a tuning range of 46.6 to 64.6 GHz, an 18 GHz tuning band. The local oscillator drive to the mixer was provided by a 45.69 GHz lumped element oscillator. The resulting down converted mixer output was 1 to 19 GHz as shown in FIG. 10.

Figure 9:
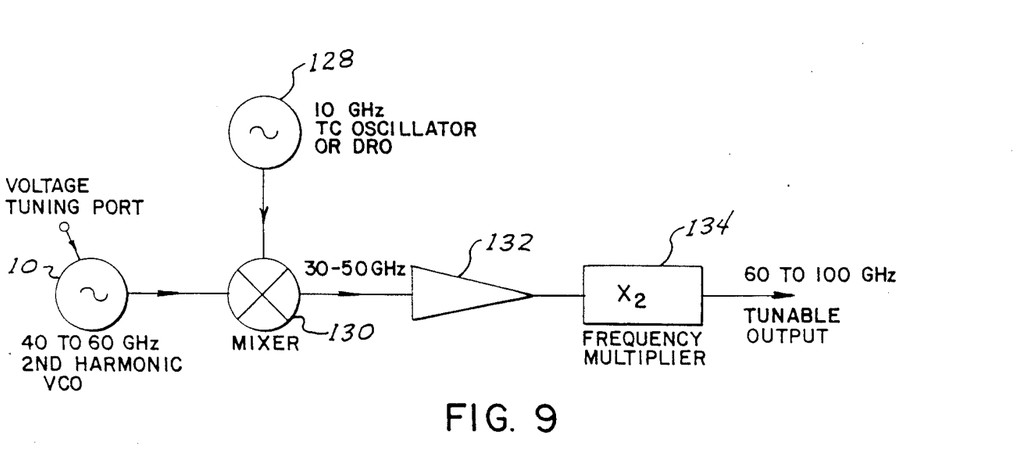
FIG. 9 shows a frequency enhanced ultrawideband millimeter wave VCO system.

Another application of the above described second harmonic VCO 10 is shown in FIG. 9. In this application, a local oscillator 128 with a significantly lower local oscillator frequency of 10 GHz is used for the down conversion at mixer 130. The 40 to 60 GHz output of the VCO is down converted to the 30 to 50 GHz band. The down converted 20 GHz wide output is amplified at amplifier 132 and frequency multiplied by 2 at multiplier 134 to produce a 60 to 100 GHz output. The 20 GHz wide tuning band of the 40 to 60 GHz VCO has been increased to a 40 GHz wide band in the 60 to 100 GHz range. This range exceeds the 60 to 90 GHz band coverage of WR-12 waveguide that is the standard for use in this frequency region and exemplifies the extreme tuning range of the VCO system. The VCO arrangement in FIG. 9 illustrates a means to enhance the frequency tuning capability of the basic ultrawideband VCO 10. Frequency multipliers and amplifiers are known technologies, but the use of a single ultrawideband VCO as a drive source gives practicality to the realization of such ultrawideband VCO systems. The ability to provide more than full waveguide band tunable frequency coverage at short millimeter wavelengths has heretofore been impractical due to the complexity incurred if a multiplicity of drive sources are to be used.

It is recognized that various equivalents, alternatives and modifications are possible within the scope of the appended claims.

We claim:

1. A varactor tuned oscillator, VCO, operational in the millimeter wave range including frequencies greater than 30 GHz, comprising a lumped element active circuit including an active element with a negative resistance, and a lumped element tuning circuit coupled to said active circuit and providing resonant circuitry in combination therewith, and a high pass filter closely coupled to said active circuit to prevent propagation of fundamental frequency energy beyond said active circuit and to provide a VCO output passing a higher order output harmonic at least as high as the second order, said closely coupled high pass filter eliminating long line effect and limiting energy circulation at fundamental frequency to the region of said active circuit to circulate fundamental frequency energy back to said active element to generate more higher order harmonic energy and eliminating the intrinsic diminishing effect on tuning range of resistive loading, whereby to extend tuning range and provide an ultrabroadband VCO.

2. The invention according to claim 1 wherein said VCO output is resistively loaded at said higher order harmonic, and wherein said high pass filter is closely coupled within a quarter wavelength of said active circuit at fundamental frequency.

3. The invention according to claim 2 wherein said VCO has a continuous tuning range of about 20 GHz in the V band, 50–75 GHz.

4. The invention according to claim 3 wherein said tuning range is about ±10 GHz at a center frequency of about 56 GHz.

5. The invention according to claim 2 wherein said tuning range is at least about 30% of center frequency.

6. The invention according to claim 2 wherein said higher order harmonic is generated in-situ in said active element without a separate broadband doubler circuit.

7. A varactor tuned oscillator, VCO, operational in the millimeter wave range including frequencies greater than 30 GHz, comprising a lumped element active circuit lumped element tuning circuit coupled to said active circuit and providing resonant circuitry in combination therewith, and a high pass filter closely coupled to said active circuit to prevent propagation of fundamental energy beyond said active circuit and to provide a VCO output passing a higher order harmonic at least as high as the second order, said VCO output being reactively terminated at fundamental frequency and resistively loaded at said higher order harmonic, said fundamental frequency being isolated from said resistively loaded output by harmonic generation in said active element, said closely coupled high pass filter eliminating long line effect and limiting energy circulation at fundamental frequency to the region of said active circuit to circulate fundamental frequency energy back to said active element to generate more higher order harmonic energy.

8. The invention according to claim 7 wherein said VCO output is transparent to and passes said higher order harmonic.

9. The invention according to claim 8 wherein said higher order harmonic is generated in-situ in said active element, and comprising a capacitor capacitively coupling said active element to said VCO output and passing said higher order harmonic, and a VCO output conductor having an end terminated in a waveguide cut-off at the fundamental frequency of oscillation, said conductor end terminated in said waveguide providing DC bias isolation.

10. A varactor tuned oscillator, VCO, operational in the millimeter wave range including frequencies greater than 30 GHz, comprising a lumped element active circuit including an active element with a negative resistance, and a lumped element tuning circuit coupled to said active circuit and providing resonant circuitry in combination therewith, said VCO having an output coupled to an output waveguide cut-off at the fundamental frequency of oscillation to reactively terminate said VCO output at fundamental frequency, said waveguide passing a higher order harmonic at least as high as the second order to provide resistive loading of said VCO output at said higher order harmonic.

11. The invention according to claim 10 wherein said higher order harmonic is generated in-situ in said active element, said fundamental frequency being isolated from said resistive loading of said output waveguide by harmonic generation in said active element.

12. A varactor tuned oscillator, VCO, operational in the millimeter wave range including frequencies greater than 30 GHz, comprising:
   a lumped element active circuit including an active element with a negative resistance;
   a lumped element tuning circuit coupled to said active circuit and providing resonant circuitry in combination therewith;
   a high pass filter closely coupled to said active circuit to prevent propagation of fundamental frequency energy beyond said active circuit and to provide a VCO output reactively terminated at the fundamental frequency of oscillation and resistively loaded at a higher order harmonic at least as high as the second order, said closely coupled high pass filter eliminating long line effect and limiting energy circulation at fundamental frequency to the region of said active circuit to circulate fundamental frequency energy back to said active element to generate more higher order harmonic energy;
   a first bias port for varactor tuning;
   a second bias port for biasing said active element;
   a first quarter wave choke at ≦ said higher order harmonic having first and second terminals, said first terminal of said choke being coupled to said first bias port;
   a second quarter wave choke at ≦ said higher order harmonic having first and second terminals, said first terminal of said choke being coupled to said second bias port;
   said tuning circuit having first and second terminals, said first terminal of said tuning circuit being coupled to said second terminal of said first choke;
   said active circuit having first and second terminals, said first terminal of said active circuit being coupled to said second terminal of said second choke and to said first terminal of said tuning circuit and to said VCO output, said second terminal of said active circuit being coupled to said second terminal of said tuning circuit;
   said high pass filter providing a load circuit coupled to said VCO output at said first terminal of said active circuit, said load circuit reactively terminating said VCO output at said fundamental frequency and resistively loading said VCO output at said higher order harmonic and passing said higher order harmonic.

13. The invention according to claim 12 comprising:
   a first capacitor having first and second terminals, said first terminal of said first capacitor being connected to a node between said first bias port and said first terminal of said first choke, said second terminal of said first capacitor being connected to said second terminal of said tuning circuit;
   a second capacitor having first and second terminals, said first terminal of said second capacitor being connected to a node between said second terminal of said first choke and said first terminal of said tuning circuit, said second terminal of said second capacitor being connected to a node between said second terminal of said second choke and said first terminal of said active circuit;
   a third capacitor having first and second terminals, said first terminal of said third capacitor being connected to a node between said second terminal of said second choke and said first terminal of said active circuit, said second terminal of said third capacitor being coupled to said load circuit;
   a fourth capacitor having first and second terminals, said first terminal of said fourth capacitor being connected to a node between said second bias port and said first terminal of said second choke, said second terminal of said fourth capacitor being connected to said second terminal of said active circuit.

14. A varactor tuned oscillator, VCO, operational in the millimeter wave range including frequencies greater than 30 GHz, comprising:
   a lumped element active circuit including an active element with a negative resistance;
   a lumped element turning circuit coupled to said active circuit and providing resonant circuitry in combination therewith;
   a VCO output reactively terminated at the fundamental frequency of oscillation and resistively loaded at a higher order harmonic at least as high as the second;
   a first bias port for varactor tuning;
   a second bias port for biasing said active element;
   a first quarter wave choke at ≦ said higher order harmonic having first and second terminals, said first terminal of said choke being coupled to said first bias port;
   a second quarter wave choke at ≦ said higher order harmonic having first and second terminals, said first terminal of said second choke being coupled to said second bias port;
   said tuning circuit having first and second terminals, said first terminal of said tuning circuit being coupled to said second terminal of said first choke;
   said active circuit having first and second terminals, said first terminal of said active circuit being coupled to said second terminal of said second choke and to said first terminal of said tuning circuit and to said VCO output, said second terminal of said active circuit being coupled to said second terminal of said tuning circuit;
   a load circuit coupled to said VCO output at said first terminal of said active circuit, said load circuit reactively terminating said VCO output at said fundamental frequency and resistively loading said VCO output at said higher order harmonic and passing said higher order harmonic;
   a first capacitor having first and second terminals, said first terminal of said first capacitor being connected to a node between said first bias port and said first terminal of said first choke, said second terminal of said first capacitor being connected to said second terminal of said tuning circuit;
   a second capacitor having first and second terminals, said first terminal of said second capacitor being connected to a node between said second terminal of said first choke and said first terminal of said tuning circuit; said second terminal of said second capacitor being connected to an node between said second terminal of said second choke and said first terminal of said active circuit;

a third capacitor having first and second terminals, said first terminal of said third capacitor being connected to a node between said second terminal of said second choke and said first terminal of said active circuit, said second terminal of said third capacitor being coupled to said load circuit;

a fourth capacitor having first and second terminals, said first terminal of said fourth capacitor being connected to a node between said second bias port and said first terminal of said second choke, said second terminal of said fourth capacitor being connected to said second terminal of said active circuit, wherein said load circuit comprises an output waveguide cut off at said fundamental frequency and propagating said higher order harmonic.

15. The invention according to claim 14 comprising an output conductor coupling said active element to said load circuit, said conductor having a first end at said first terminal of said active circuit and a second end at said load circuit, said third capacitor being connected between said first end of said conductor and said first terminal of said active circuit.

16. The invention according to claim 15 wherein said first end of said conductor is spaced from said first terminal of said active circuit by an air gap therebetween, and wherein said third capacitor is provided by said air gap.

17. A method for expanding the tuning range of a varactor tuned oscillator, VCO, operational in the millimeter wave range including frequencies greater than 30 GHz, said VCO having a lumped element act iv circuit including an active element with a negative resistance, and a lumped element tuning circuit coupled to said active circuit and providing resonant circuitry in combination therewith, said method comprising maximizing the effect capacitance ratio of said varactor by providing a high pass filter closely coupled to said active circuit and preventing propagation of fundamental frequency energy beyond said active circuit and reactively terminating the output of said VCO at fundamental frequency and minimizing resistive loading of said VCO at fundamental frequency, and resistively loading and propagating the output of said VCO at a higher order harmonic at least as high as the second order, and eliminating long line effect and limiting energy circulation at fundamental frequency to the region of said active circuit to circulate fundamental frequency energy back to said active element to generate more higher order harmonic energy.

18. The invention according to claim 17 comprising tuning said VCO at the reactively terminated fundamental frequency.

19. The invention according to claim 18 comprising tuning said VCO over a range of about 20 GHz in the V band, 50-75 GHz.

20. The invention according to claim 19 comprising tuning said VCO over the range of about ±10 GHz at a center frequency of about 56 GHz.

21. The invention according to claim 18 comprising tuning said VCO over a range of at least about 30% of center frequency.

* * * * *